United States Patent
Cooney, III et al.

(10) Patent No.: US 7,843,039 B2
(45) Date of Patent: Nov. 30, 2010

(54) STRESS-MODIFIED DEVICE STRUCTURES, METHODS OF FABRICATING SUCH STRESS-MODIFIED DEVICE STRUCTURES, AND DESIGN STRUCTURES FOR AN INTEGRATED CIRCUIT

(75) Inventors: Edward C. Cooney, III, Jericho, VT (US); Mark Dupuis, South Burlington, VT (US); William J. Murphy, North Ferrisburg, VT (US); Steven S. Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 286 days.

(21) Appl. No.: 12/030,917

(22) Filed: Feb. 14, 2008

(65) Prior Publication Data

US 2009/0206449 A1 Aug. 20, 2009

(51) Int. Cl.
*H01L 29/73* (2006.01)
*H01L 21/331* (2006.01)

(52) U.S. Cl. ............................ 257/593; 257/E21.382; 257/E29.174

(58) Field of Classification Search ............... 438/783; 257/593, E21.382, E29.174
See application file for complete search history.

(56) References Cited

U.S. PATENT DOCUMENTS

| 3,454,845 | A | 7/1969 | Sikorski |
| 6,949,443 | B2 | 9/2005 | Ke et al. |
| 2006/0289900 | A1 | 12/2006 | Thirupapuliyur et al. |
| 2007/0018203 | A1* | 1/2007 | Atanackovic et al. ....... 257/254 |
| 2007/0249069 | A1 | 10/2007 | Alvarez et al. |

* cited by examiner

*Primary Examiner*—N Drew Richards
*Assistant Examiner*—Mamadou Diallo
(74) *Attorney, Agent, or Firm*—Wood, Herron & Evans, LLP (57) ABSTRACT

Stress-modified device structures, methods of fabricating such stress-modified device structures, and design structures for an integrated circuit. An electrical characteristic of semiconductor devices formed on a common substrate, such as the current gains of bipolar junction transistors, may be altered by modifying stresses in structures indirectly on or over, or otherwise indirectly coupled with, the semiconductor devices. The structures, which may be liners for contacts in a contact level of an interconnect, are physically spaced away from, and not in direct physical contact with, the respective semiconductor devices because at least one additional intervening material or structure is situated between the stress-imparting structures and the stress-modified devices. The intervening materials or structures, such as contacts extending through an insulating layer of a local interconnect level between the contact level and the semiconductor devices, provide paths for the transfer of stress from the stress-imparting structures to the stress-modified semiconductor devices.

16 Claims, 9 Drawing Sheets

STRESS-MODIFIED DEVICE STRUCTURES, METHODS OF FABRICATING SUCH STRESS-MODIFIED DEVICE STRUCTURES, AND DESIGN STRUCTURES FOR AN INTEGRATED CIRCUIT

FIELD OF THE INVENTION

The invention relates generally to semiconductor device fabrication and, in particular, to device structures and methods for imparting strain to device structures and design structures for an integrated circuit containing such strain-modified devices.

BACKGROUND OF THE INVENTION

A bipolar junction transistor (BJT) consists of three differently doped semiconductor regions, namely the emitter region, the base region, and the collector region. A bipolar junction transistor includes a pair of P-N junctions, namely an emitter-base junction and a collector-base junction. An NPN-type bipolar junction transistor has a thin region of p-type semiconductor material constituting the base region between two regions of n-type semiconductor material constituting the emitter and collector regions. A PNP-type bipolar junction transistor has a thin region of n-type semiconductor material constituting the base region between two regions of p-type semiconductor material constituting the emitter and collector regions.

A voltage applied across the emitter-base junction controls the movement of charge carriers that produces current flow between the collector and emitter regions of a bipolar junction transistor. Because the collector region surrounds the emitter region, almost all of the charge carriers injected into the base region are collected. As a result, a small current entering the base region of a NPN transistor, or flowing from the base region in the case of a PNP transistor, is highly amplified in the collector output. Because electron mobility is higher than hole mobility in silicon, NPN-type bipolar junction transistors offer greater currents and faster operation under most circumstances than PNP-type bipolar junction transistors. As a consequence, NPN-type bipolar junction transistors are the prevalent type of bipolar junction transistor currently used in contemporary integrated circuits.

A key metric indicative of the efficiency of a bipolar junction transistor is the proportion of charge carriers able to cross the base region and reach the collector region without recombination. The ratio of the collector current to the base current, which is known as the current gain or beta ($\beta$), is typically greater than about 100. An increase in carrier mobility is effective to enhance the current gain of a bipolar junction transistor.

Carrier mobility in a field effect transistor fabricated by a complementary metal oxide semiconductor process can be modified by applying mechanical stress to the channel region. One approach is to strain the crystal lattice of the channel region with a stress-imparting conformal, capping layer composed of an insulating material, such as a compressively-stressed or tensilely-stressed capping layer of silicon nitride. The silicon nitride capping layer induces compressive or tensile stress in the channel region. Another approach is to introduce so-called stressors directly into the device structure that are capable of straining the crystal lattice of the channel region. For example, embedded silicon-germanium stressors may be formed beneath the source and drain regions of a field effect transistor so as to deliver compressive or tensile strain to the intervening channel region.

There is a need for continued improvement in stress-modified device structures and related fabrication methods that are capable of improving device performance in semiconductor devices, like bipolar junction transistors, without the use of a stress-imparting layer of an insulating material and without physical modifications to the construction of the semiconductor device itself, as well as a need for related design structures for integrated circuits.

SUMMARY OF THE INVENTION

In one embodiment, a device structure is provided that includes first and second semiconductor devices formed using a substrate, a first stress-imparting structure indirectly coupled with a portion of the first semiconductor device, and a second stress-imparting structure indirectly coupled with a portion of the second semiconductor device. The second semiconductor device has a spaced-apart spatial relationship on the substrate in relation to the first semiconductor device. The first stress-imparting structure is configured to impart a first stress to the first semiconductor device. The second stress-imparting structure is configured to impart a second stress to the second semiconductor device that differs in magnitude from the first stress. In one specific embodiment, the differing first and second stresses may be effective to, for example, provide different current gains for first and second semiconductor devices that have the representative form of bipolar junction transistors. These bipolar junction transistors may be on the same chip or die, which consist of a single piece of semiconductor containing an entire integrated circuit, that is cut from the common substrate.

In another embodiment, the device structure may be included in a design structure embodied in a machine readable medium for designing, manufacturing, or testing an integrated circuit. The design structure may comprise a netlist and may reside on storage medium as a data format used for the exchange of layout data of integrated circuits.

In another embodiment, a device structure includes a semiconductor device with a first device region and a second device region, a first stress-imparting structure indirectly coupled with the first device region, and a second stress-imparting structure indirectly coupled with the second device region. The first stress-imparting structure is configured to impart a first stress to the first device region. The second stress-imparting structure is configured to impart a second stress to the second device region that differs in magnitude from the first stress.

In another embodiment, a method is provided for tailoring an electrical property of first and second semiconductor devices on a substrate. The method includes indirectly applying a first stress from a first stress-applying structure to a portion of the first semiconductor device. The method further includes indirectly applying a second stress that differs from the first stress from a second stress-applying structure to a portion of the second semiconductor device. An analogous method may be applicable in which the first and second stress-applying structures apply different stresses to different device regions of a single semiconductor device.

DETAILED DESCRIPTION

Generally, embodiments of the present invention relates to affecting the performance of semiconductor devices (e.g., the current gains of bipolar junction transistors) formed on a common substrate by modifying stresses in structures indirectly on or over, or otherwise indirectly coupled with, the semiconductor devices. The structures are physically spaced away from, and not in direct physical contact with, the respective semiconductor devices because at least one additional intervening material or structure is situated between the stress-imparting structures (i.e., stressors) and the stress-modified devices. These additional intervening materials or structures provide paths for the transfer of stress from the stress-imparting structures to the stress-modified semiconductor devices.

By way of example, a specific embodiment of the invention relates to forming bipolar junction transistors with different current gains (i.e., different betas) on the same substrate by forming contact liner layers with different stresses in contacts associated with different bipolar junction transistors. As a more specific example, a first material and/or physical layer thickness for the liners acts as a first stress-imparting structure that imparts a first stress on a first bipolar junction transistor resulting in a first current gain. On the same chip as the first stress-imparting structure and the first bipolar junction transistor, a second material and/or physical layer thickness for the liners acts as a second stress-imparting structure that imparts a second stress on a second bipolar junction transistor resulting in a second current gain different than the first current gain. Other variations may include, but are not limited to, the absence of a stress-imparting structure associated with one bipolar junction transistor but the existence of a stress-imparting structure associated with another bipolar junction transistor on the same chip.

Although embodiments of the invention art described in conjunction with a semiconductor device in the representative form of a vertical bipolar junction transistor, a person having ordinary skill in the art will recognize that the inventive indirect stress-imparting structures may be used in conjunction with lateral bipolar junction transistors. Moreover, the inventive indirect stress-imparting structures may find use in conjunction with other types of semiconductor devices, such as metal-oxide-semiconductor field effect transistors.

Figure 1:
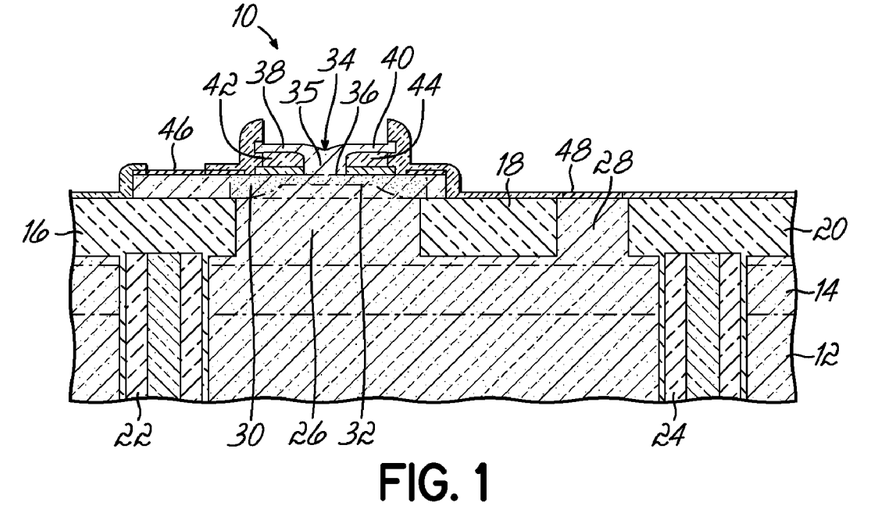
FIGS. 1-5 are diagrammatic cross-sectional views of a portion of a substrate at successive fabrication stages of a processing method for fabricating a device structure in accordance with an embodiment of the invention.

With reference to FIG. 1 and in accordance with an embodiment of the invention, a bipolar junction transistor 10 is fabricated as one of a plurality of substantially identical bipolar junction transistors using a substrate 12. The substrate 12 may be any suitable substrate, such as the illustrated bulk silicon substrate, containing a semiconductor material that a person having ordinary skill in the art would recognize as suitable for forming an integrated circuit. The substrate 12 may be composed of a monocrystalline silicon-containing material, such as single crystal silicon with a (100) crystal lattice orientation. The semiconductor material constituting substrate 12 may be lightly doped with an impurity to alter its electrical properties. Specifically, the substrate 12 may be lightly doped with an n-type impurity species to render it initially n-type or lightly doped with a p-type impurity species to render it initially p-type. Alternatively, the substrate 12 may be formed from any other suitable semiconductor material including, but not limited to, gallium arsenide, germanium, silicon-germanium, or indium phosphide, as well as layered semiconductor structures including, but not limited to, a silicon-on-insulator substrate (SOI) or a strained silicon substrate.

A buried conductive layer, which operates as a sub-collector region 14 of the bipolar junction transistor 10, is formed as a doped region in the semiconductor material of the substrate 12 by high-dose ion implantation of an impurity of a suitable conductivity type, followed by a high-temperature thermal anneal to activate the impurity and to repair the implantation damage to the crystal lattice. Optionally, an epitaxial device layer may be formed on the substrate 12, which is considered herein to be subsumed into the substrate 12, after the sub-collector region 14 is formed.

Shallow trench isolation regions, of which shallow trench isolation regions 16, 18, 20 are representative, and deep trench isolation regions, of which deep trench isolation regions 22, 24, are representative, are provided in the semiconductor material of the substrate 12. The deep trench isolation regions 22, 24 extend through the sub-collector region 14 into the substrate 12 and connect to encircle the perimeter of the bipolar junction transistor 10. The shallow trench isolation regions 16, 18, 20 also extend into the substrate 12 to a shallower depth than the deep trench isolation regions 22, 24, but do not penetrate into the sub-collector region 14. The shallow trench isolation regions 16, 18, 20 and deep trench isolation regions 22, 24 cooperate to electrically isolate the bipolar junction transistor 10 from adjacent devices.

The dielectric material contained in the shallow trench isolation regions 16, 18, 20 and deep trench isolation regions 22, 24 may comprise silicon oxide ($SiO_2$), and can be formed using standard techniques. For example, trenches may be defined using standard lithography and anisotropic dry etching, filled with dielectric material, such as an oxide like densified tetraethylorthosilicate (TEOS) deposited by thermal chemical vapor deposition (CVD) or a high density plasma (HDP) oxide, and planarized by a conventional chemical mechanical polishing (CMP) process. The planarization removes extraneous dielectric material from the top surface of the substrate 12.

A collector region 26 is disposed between shallow trench isolation regions 16, 18 and a reach-through region 28 is disposed adjacent to the collector region 26 between shallow trench isolation regions 16, 18. Collector region 26 and reach-through region 28 are formed by doping the semiconductor material of the substrate 12 by, for example, implanting a dose of a suitable impurity. The reach-through region 28 is electrically isolated from the collector region 26 by shallow trench isolation region 18. The sub-collector region 14 provides a lateral conductive path from beneath the active region of the bipolar junction transistor 10 to the reach-through region 28. In one embodiment in which the bipolar junction transistor 10 is NPN-type, the semiconductor material of the collector region 26 and reach-through region 28 may be heavily doped with a concentration of an impurity species (e.g., an impurities species like antimony, phosphorus, or arsenic from Group V of the Periodic Table) effective to impart an n-type conductivity in which electrons are the majority carriers and dominate the electrical conductivity of the material.

The bipolar junction transistor 10 further includes a base region 30 of a semiconductor material that is moderately doped with an impurity of opposite conductivity type to the impurity contained in the collector region 26. A p-n junction 32 is defined by the locus of points or transition between conductivity types for which the net doping concentration is null or zero between the oppositely-doped collector region 26 and base region 30. The semiconductor material constituting the base region 30 is doped with an impurity having an opposite conductivity type to the impurity used to dope the semiconductor material of the collector region 26. In one embodiment in which the bipolar junction transistor 10 is NPN-type, the semiconductor material of the base region 30 may be doped with an impurity species (e.g., an impurity species like boron, indium, or gallium from Group III of the Periodic Table) effective to impart a p-type conductivity in which holes are the majority carriers and dominate the electrical conductivity of the material. Alternatively, the conductivity types of the impurity species may be reversed so that the bipolar junction transistor 10 is a PNP-type.

The bipolar junction transistor 10 further includes an emitter region 34 of a semiconductor material that is heavily doped with an impurity of opposite conductivity type to the impurity contained in the base region 30 and of the same conductivity type as the impurity contained in the collector region 26. The emitter region 34 is physically separated from the collector region 26 by the base region 30. The emitter region 34, which is T-shaped, includes a central leg 35 that directly contacts the base region 30 across a p-n junction 36 is defined by the locus of points or transition between conductivity types for which the net doping concentration is null or zero between the oppositely-doped base region 30 and emitter region 34. The emitter region 34 further includes arms 38, 40 that are electrically isolated from the base region 30 by dielectric regions 42, 44.

Conductive layers 46, 48 are respectively formed on the exposed top surfaces of the base region 30 and the reach-through region 28. The conductive layers 46, 48 may be composed of a silicide formed by a conventional silicidation process familiar to a person having ordinary skill in the art. In a representative silicidation process, the conductive layers 46, 48 may be formed by depositing a layer of suitable metal, such as nickel, cobalt, tungsten, titanium, etc., and then annealing at a temperature sufficient to react the metal with the semiconductor material (e.g., silicon) of the base region 30 and reach-through region 28. The silicidation process may be conducted in an atmosphere containing an inert gas or a nitrogen-rich gas, and at a temperature of about 350° C. to about 600° C. depending on the type of silicide being considered for conductive layers 46, 48. Following the high temperature anneal, unreacted metal is selectively removed with, for example, an isotropic wet chemical etch process.

In one embodiment in which the bipolar junction transistor 10 is an NPN-type device, the collector region 26 and the emitter region 34 may be doped with a moderate concentration of an n-type impurity species, and the base region 30 may be doped with a concentration of a p-type impurity species. The reach-through region 28 and sub-collector region 14 may also be heavily doped with a relatively high concentration of an n-type impurity species and the substrate 12 may be lightly doped with a concentration of a p-type impurity species. Although illustrated as having an NPN doping configuration for the collector region 26, base region 30, and emitter region 34, the fabrication of the bipolar junction transistor 10 may be modified to provide a PNP doping scheme for the collector region 26, base region 30, and emitter region 34 as understood by a person having ordinary skill in the art.

Figure 2:
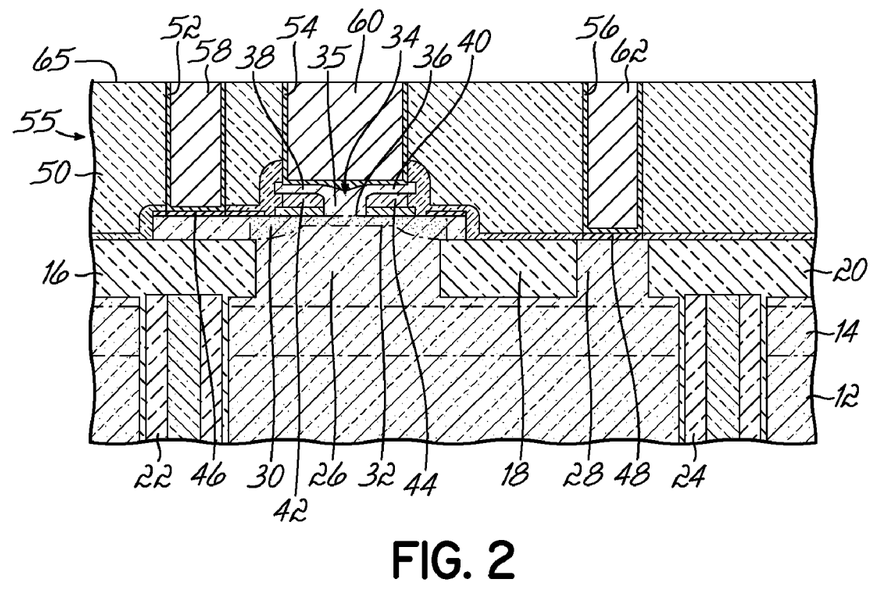

With reference to FIG. 2 in which like reference numerals refer to like features in FIG. 1 and at a subsequent fabrication stage, a conformal insulating layer 50 of a dielectric material is applied across the bipolar junction transistor 10 and planarized by a conventional planarization process, like a CMP process, as an initial step in fabricating a local interconnect level 55. The CMP process combines abrasion and dissolution to remove topography from the surface that is caused by the underlying bipolar junction transistor 10. The dielectric material of the insulating layer 50, which provides an interlayer dielectric layer for contact formation, may be composed of oxide, a phosphosilicate glass (PSG), a borophosphosilicate glass (BPSG), or a low-k dielectric material deposited by a technique apparent to a person having ordinary skill in the art. In an alternative embodiment, the insulating layer 50 may contain multiple sub-layers of different dielectric materials.

The dielectric material in the insulating layer 50 is lithographically patterned in a conventional manner to form via apertures extending from the top surface 65 of insulating layer 50 to the reach-through region 28, base region 30, and emitter region 34. A conductive liner 52, 54, 56 is applied to the dielectric material of the insulating layer 50 bordering the via apertures. A conductive material is deposited using conventional processing, such as CVD or plating, that fills the via apertures to define contacts 58, 60, 62 that extend to the reach-through region 28, base region 30, and emitter region 34, respectively. Conductive materials suitable for forming the contacts 58, 60, 62 may include, but are not limited to, metals such as tungsten, copper, aluminum, silver, gold, and alloys thereof. The respective liner 52, 54, 56 between each of the contacts 58, 60, 62 and the dielectric material in the insulating layer 50 operates as a barrier that prevents migration of the conductive material from the contacts 58, 60, 62 into the surrounding dielectric material. The liners 52, 54, 56 may be comprised of, for example, a titanium/titanium nitride bilayer or a tantalum/tantalum nitride bilayer applied by conventional deposition processes. However, the liners 52, 54, 56 may be omitted with an appropriate selection of conductive material for contacts 58, 60, 62.

Contact 58 of the local interconnect level 55 is electrically connected with the base region 30 as mediated by the conductive layer 46. Contact 60 of the local interconnect level 55 is electrically connected with the emitter region 34 of the bipolar junction transistor 10. Contact 62 of the local interconnect level 55 is electrically connected with the conductive layer 48 on the reach-through region 28 and, therefore, with the reach-through region 28. The reach-through region 28 provides a vertical conductive path from the sub-collector region 14 to the contact 62. The sub-collector region 14, which extends laterally beneath the shallow trench isolation region 18 from the collector region 26 to the reach-through region 28 to laterally offset the collector region 26 from the reach-through region 28.

Figure 3:
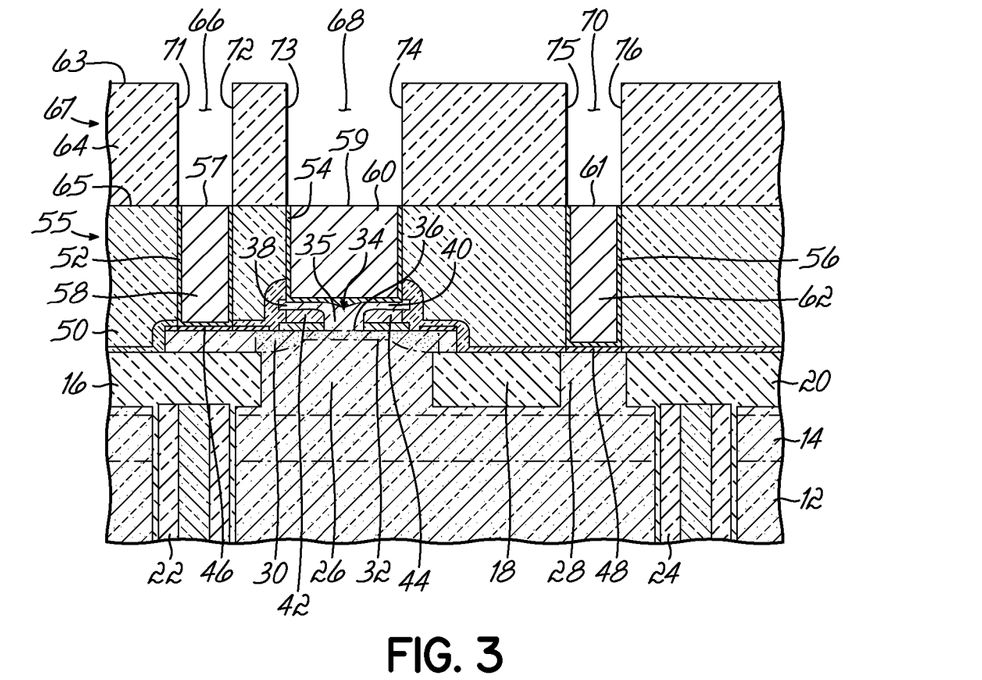

With reference to FIG. 3 in which like reference numerals refer to like features in FIG. 2 and at a subsequent fabrication stage, an insulating layer 64 is applied on a top surface 65 of the insulating layer 50 as an initial step in forming a contact level 67. Contact level 67 is directly over local interconnect level 55 and indirectly over the bipolar junction transistor 10 because of the presence of the local interconnect level 55.

Insulating layer 64 may be composed of any organic or inorganic dielectric material recognized by a person having ordinary skill in the art, which may be deposited by any of number of well known conventional techniques such as sputtering, spin-on application, a CVD process, or a plasma enhanced CVD (PECVD) process. Representative inorganic dielectric materials for insulating layer 64 include, but are not limited to, silicon dioxide, fluorine-doped silicon glass (FSG), carbon doped oxide, fluorinated silicon oxide, and combinations of these dielectric materials. The dielectric material constituting insulating layer 64 may be characterized by a relative permittivity or dielectric constant smaller than about 3.0. Representative low-k dielectric materials for insulating layer 64 include, but are not limited to, porous and nonporous spin-on organic low-k dielectrics, such as spin-on aromatic thermoset polymer resins like polyimides and fluorinated polyimides and vapor-phase deposited polymer resins like parylene, porous and nonporous inorganic low-k dielectrics, such as organosilicate glasses, siloxanes, silsesquioxanes, hydrogen-enriched silicon oxycarbide (SiCOH), amorphous carbon and fluorinated carbon films, and carbon-doped oxides, and combinations of organic and inorganic dielectrics in a layered structure. Such low-k materials may operate to reduce the capacitance of the completed interconnect structure as understood by a person having ordinary skill in the art.

Openings 66, 68, 70 are defined in insulating layer 64 using a conventional lithography and etching process. Specifically, a resist (not shown) is applied to a top surface 63 of the insulating layer 64, the resist is exposed to a pattern of radiation characteristic of the opening pattern, the latent pattern transferred into the exposed resist is developed, and then insulating layer 64 is etched using the patterned resist as a template to transfer the openings from the patterned resist to the insulating layer 64. Suitable etching processes include any conventional anisotropic dry etching process, such as RIE or plasma etching. The chemistry of the etching process, which may be conducted in a single etching step or multiple steps, removes portions of the insulating layer 64 visible through the patterned resist and stops vertically approximately at the depth of the top surface 65 of the insulating layer 50. After etching is concluded, the resist is stripped by, for example, plasma ashing or exposure to a chemical stripper.

Sidewalls 71, 72 of opening 66, which extend from the top surface 63 of insulating layer 64 to the depth of the top surface 65 of the insulating layer 50, are bordered by the dielectric material of insulating layer 64. Opening 66 and contact 58 are spatially aligned so that a top surface 57 of contact 58 is exposed by opening 66. Similarly, opening 68 and contact 60 are spatially aligned so that contact 60 has a top surface 59 exposed by opening 68, and opening 70 and contact 62 are spatially aligned so that contact 62 has a top surface 61 exposed by opening 70. The cross-sectional area of each of the openings 66, 68, 70, when from a perspective normal to the respective top surfaces 57, 59, 61 of the contacts 58, 60, 62, is typically approximately equal to the cross-sectional area of the associated one of the contacts 58, 60, 62 viewed from a similar perspective.

Sidewalls 73, 74 of opening 68, which extend from the top surface 63 of insulating layer 64 to the depth of the top surface 65 of the insulating layer 50, are bordered by the dielectric material of insulating layer 64. Sidewalls 74, 75 of opening 70, which extend from the top surface 63 of insulating layer 64 to the depth of the top surface 65 of the insulating layer 50, are bordered by the dielectric material of insulating layer 64. The etching process may stop on the conductive material of contacts 58, 60, 62, which etches selective to the dielectric material of insulating layer 64.

Figure 4:
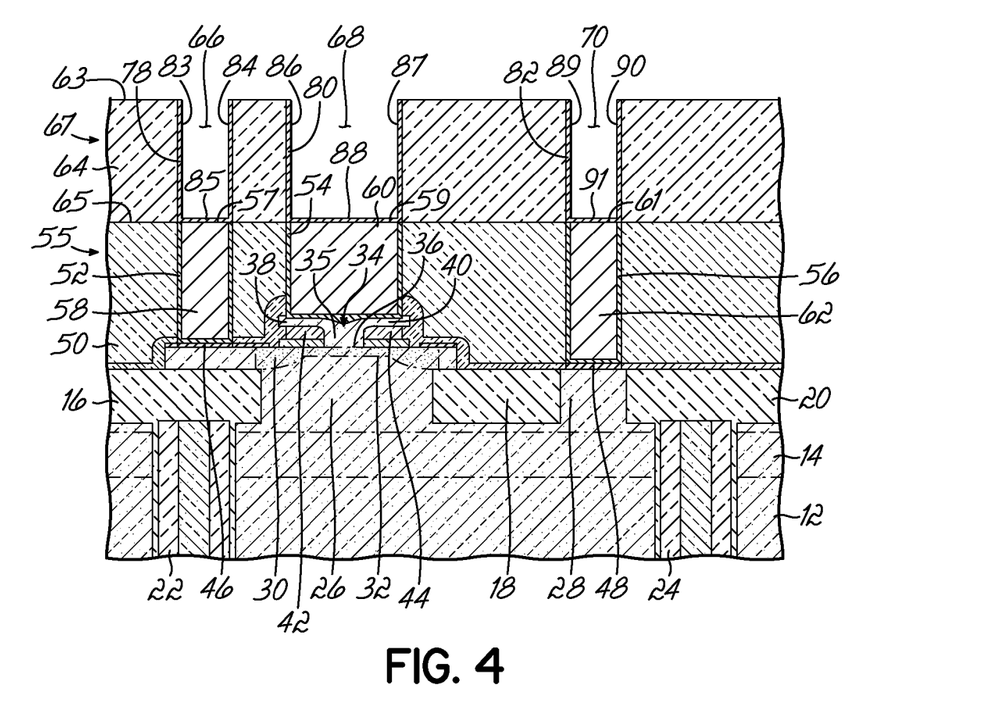

With reference to FIG. 4 in which like reference numerals refer to like features in FIG. 3 and at a subsequent fabrication stage, a liner 78 is applied to the dielectric material of insulating layer 64 bordering the sidewalls 71, 72 of opening 66 (FIG. 3), a liner 80 is applied to the dielectric material of insulating layer 64 bordering the sidewalls 73, 74 of opening 68 (FIG. 3), and a liner 82 is applied to the dielectric material of insulating layer 64 bordering the sidewalls 75, 76 of opening 70 (FIG. 3). The liners 78, 80, 82, which all have the same nominal physical layer thickness and which are in intimate contact with the dielectric material constituting the insulating layer 64, define thin layers that clad or cover the sidewalls 71-76. Because the liners 78, 80, 82 have approximately equivalent thicknesses, sidewall sections 83, 84, sidewall sections 86, 87, and sidewall sections 89, 90, as well as bottom sections 85, 88, 91, have approximately the same physical layer thickness.

The liners 78, 80, 82 of the contact level 67 may be composed of electrically conductive materials selected from, but not limited to, titanium (Ti), tantalum (Ta), nickel (Ni), tungsten (W), iridium (Ir), platinum (Pt), cobalt (Co), niobium (Nb), ruthenium (Ru), and like metals, stoichiometric or non-stoichiometric nitrides of these metals, such as titanium nitride (TiN) and tantalum nitride (TaN), alloys of these metals, such as a titanium-niobium alloy, a tantalum-tungsten alloy, a tantalum-iridium alloy, or a titanium-zirconium alloy, alloys of these metals, such as an alloy of titanium and tungsten, and other like materials including combinations thereof. In the latter regard, the liners 78, 80, 82 may contain multiple individual sublayers, such as, for example, a titanium/titanium nitride bilayer or a tantalum/tantalum nitride bilayer. The order in which the individual sublayers are applied may vary. For example, the titanium sublayer of a titanium/titanium nitride bilayer may be applied before the titanium nitride sublayer, or the sublayers may be applied in a converse order. The electrically conductive materials constituting the liners 78, 80, 82 may be applied in the openings 66, 68, 70 utilizing a conventional deposition process such as a CVD process, a PECVD process, physical vapor deposition (PVD), atomic layer deposition (ALD), plating, or chemical solution deposition.

Liner 78 includes sidewall sections 83, 84 applied on the sidewalls 71, 72 (FIG. 4) of opening 66. The sidewall sections 83, 84 extend about opening 66 and, preferably, meet to define a continuous layer that clads all sidewalls of opening 66, including the sidewalls 71, 72 and other sidewalls not visible in FIG. 4. A bottom section 85 of liner 78, which is applied on the top surface 57 of the contact 58, connects the sidewall sections 83, 84. Similarly, liner 80 includes sidewall sections 86, 87 applied on the sidewalls 73, 74 (FIG. 4) of opening 68. The sidewall sections 86, 87 extend about opening 68 and, preferably, meet to define a continuous layer that clads all sidewalls of opening 68, including sidewalls 73, 74 and other sidewalls not visible in FIG. 4. A bottom section 88, which is applied on the top surface 59 of the contact 60, connects the sidewall sections 86, 87. Liner 82 includes sidewall sections 89, 90 applied on the sidewalls 75, 76 (FIG. 4) of opening 70. The sidewall sections 89, 90 extend about opening 70 and, preferably, meet to define a continuous layer that clads all sidewalls of opening 70, including sidewalls 75, 76 and other sidewalls not visible in FIG. 4. A bottom section 91 of liner 82, which is applied on the top surface 61 of the contact 62, connects the sidewall sections 89, 90.

In an embodiment of the invention, at least two of the liners 78, 80, 82 are composed of different conductive materials or combinations of different conductive materials. For example, liner 78 may be composed of a non-stoichiometric titanium nitride that is enriched in titanium, and liners 80, 82 may be composed of titanium. As another example, liner 78, 80 may be composed of stoichiometric titanium nitride and liner 82 may be composed of a tantalum/tantalum nitride bilayer. In a more specific embodiment, each of the liners 78, 80, 82 may be composed of a different conductive material. For example, liner 78 may be composed of a non-stoichiometric titanium nitride that is enriched in titanium, liner 80 may be composed of stoichiometric titanium nitride, and liner 82 may be composed of a titanium/titanium nitride bilayer. Discrete photomasking steps are required to form the liners 78, 80, 82 from different conductive materials as understood by a person having ordinary skill in the art.

The current gain (e.g., beta) of the bipolar junction transistor 10 may be modulated through the selection of conductive materials for at least two of the liners 78, 80, 82 used in the contact level 67. As a result of the customization of the constituent conductive materials of liners 78, 80, 82, the current gain for bipolar junction transistor 10 may be engineered or tuned to have a specific value. The stress is transferred to at least one or more of the collector region 26, base region 30, and emitter region 34 of the bipolar junction transistor 10. Because of the different materials composing at least two of the liners 78, 80, 82, a stress is indirectly transferred to the bipolar junction transistor 10 that can be tuned by material selection.

The stress is indirectly coupled from the stress-imparting structures defined by the liners 78, 80, 82 to the collector region 26, base region 30, and emitter region 34 of the bipolar junction transistor 10 because of the presence of at least the intervening contacts 58, 60, 62 in the local interconnect level 55. Additional intervening structures may be present, such as the reach-through region 28.

In addition, the current gain of other devices (not shown) like bipolar junction transistor 10 on substrate 12, as well as other device types on substrate 12, may be selected and tuned through the choice of conductive materials for the different liners used in the contact level 67, in analogy to the selection of conductive materials in liners 78, 80, 82 used in contact level 67 for bipolar junction transistor 10.

Figure 5:
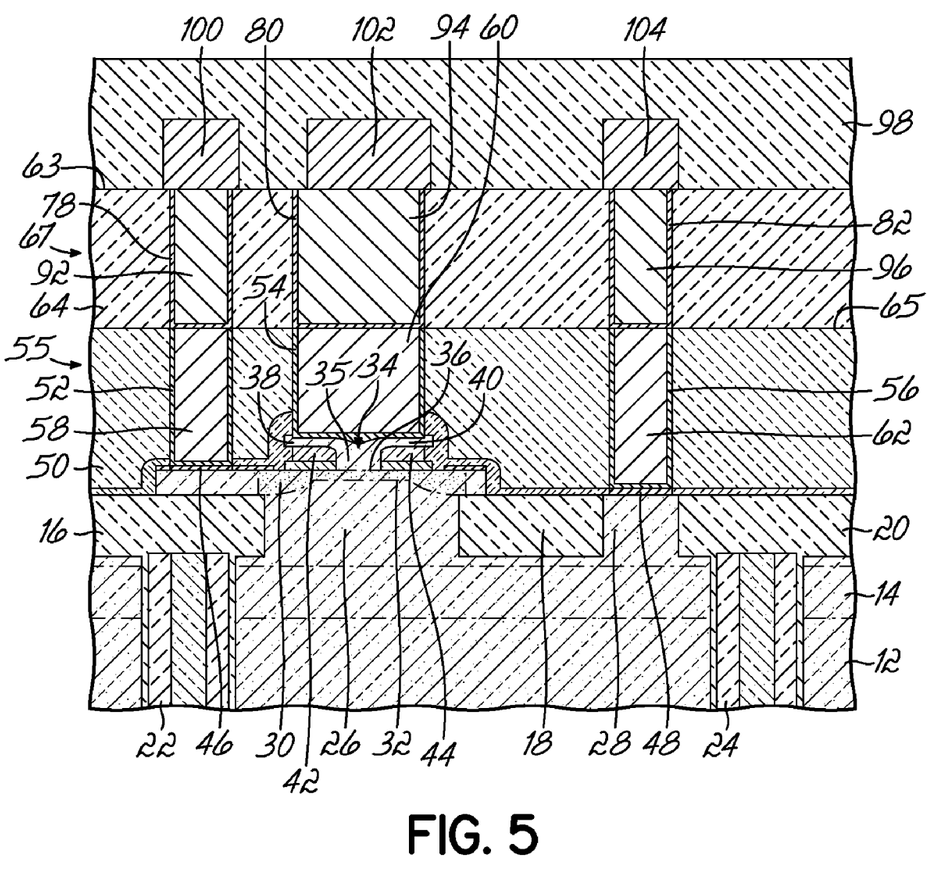

With reference to FIG. 5 in which like reference numerals refer to like features in FIG. 4 and at a subsequent fabrication stage, conductive features for the contact level 67 in the representative form of contacts 92, 94, 96 are formed in the openings 66, 68, 70 (FIG. 4). Suitable conductive materials for the contacts 92, 94, 96 include, but are not limited to, copper (Cu), aluminum (Al), gold (Au), molybdenum (Mo), tantalum (Ta), titanium (Ti), or tungsten (W), alloys of these metals, doped polysilicon, silicides, and other similar metals. These conductive materials may be concurrently deposited in openings 66, 68, 70. by conventional deposition processes including, but not limited to, evaporation, sputtering, or a CVD process and an electrochemical process like electroplating or electroless plating. Excess conductive material is removed from the top surface 63 of insulating layer 64 by a planarization process, such as a CMP process, which leaves the terminals as individual conductive features in the openings 66, 68, 70. A seed material (not shown) may be provided to promote deposition of the conductive material and may be subsumed during the deposition process, such that the seed material may become continuous with or blend into the terminals. For example, the seed material may provide a nucleation site for an electroless plating process. Seed materials may include, but are not limited to, copper (Cu), palladium (Pd), cobalt (Co), nickel (Ni), ruthenium (Ru), platinum (Pt), alloys thereof, and the like.

The contacts 92, 94, 96 provide conductive paths in insulating layer 64 with contacts 58, 60, 62 extending to the bipolar junction transistor 10 lying below the insulating layer 64 and contacts in vias (not shown but fabricated in subsequent fabrication states) lying above the insulating layer 64. The liners 78, 80, 82 separate the conductive material of the contacts 92, 94, 96 from the dielectric material of insulating layer 64. The liners 78, 80, 82 prevent at least room temperature diffusion of the conductive material contained in the contacts 92, 94, 96 into the surrounding insulating layer 64. In an alternative embodiment, one or two of the liners 78, 80, 82 may be omitted from the contact level 67. For example, liner 78 may be omitted such that the corresponding contact 92 is in intimate and direct contact with the dielectric material of insulating layer 64.

Contacts 58 and 92, as well as liners 52 and 78, cooperate to provide an electrical path from the metallization in upper level interconnect wiring with the base region 30 of the bipolar junction transistor 10. Contacts 60 and 94, as well as liners 54 and 80, cooperate to provide an electrical path from the metallization in upper level interconnect wiring with the emitter region 34 of the bipolar junction transistor 10. Contacts 62 and 96, as well as liners 56 and 82, sub-collector region 14, and reach-through region 28, cooperate to provide an electrical path from the metallization in upper level interconnect wiring with the collector region 26 of the bipolar junction transistor 10.

During the fabrication process, devices like the bipolar junction transistor 10 with contact level 67 are replicated across at least a portion of the surface area of substrate 12. Other types of device structures (not shown) may be fabricated on other surface areas of the substrate 12 and entirely independent of the fabrication process forming device structures like bipolar junction transistor 10 and contact level 67, or some of the process steps may be shared with steps used to form the conventional devices. Standard fabrication processing follows, which includes a dielectric layer 98 and metallization for the MI-level interconnect wiring in the form of conductive lines 100, 102, 104, as well as interlayer dielectric layers, metallization for conductive vias (V1, V2, etc.), and metallization for the upper level (M2-level, M3-level, etc.) interconnect wiring.

Figure 6:
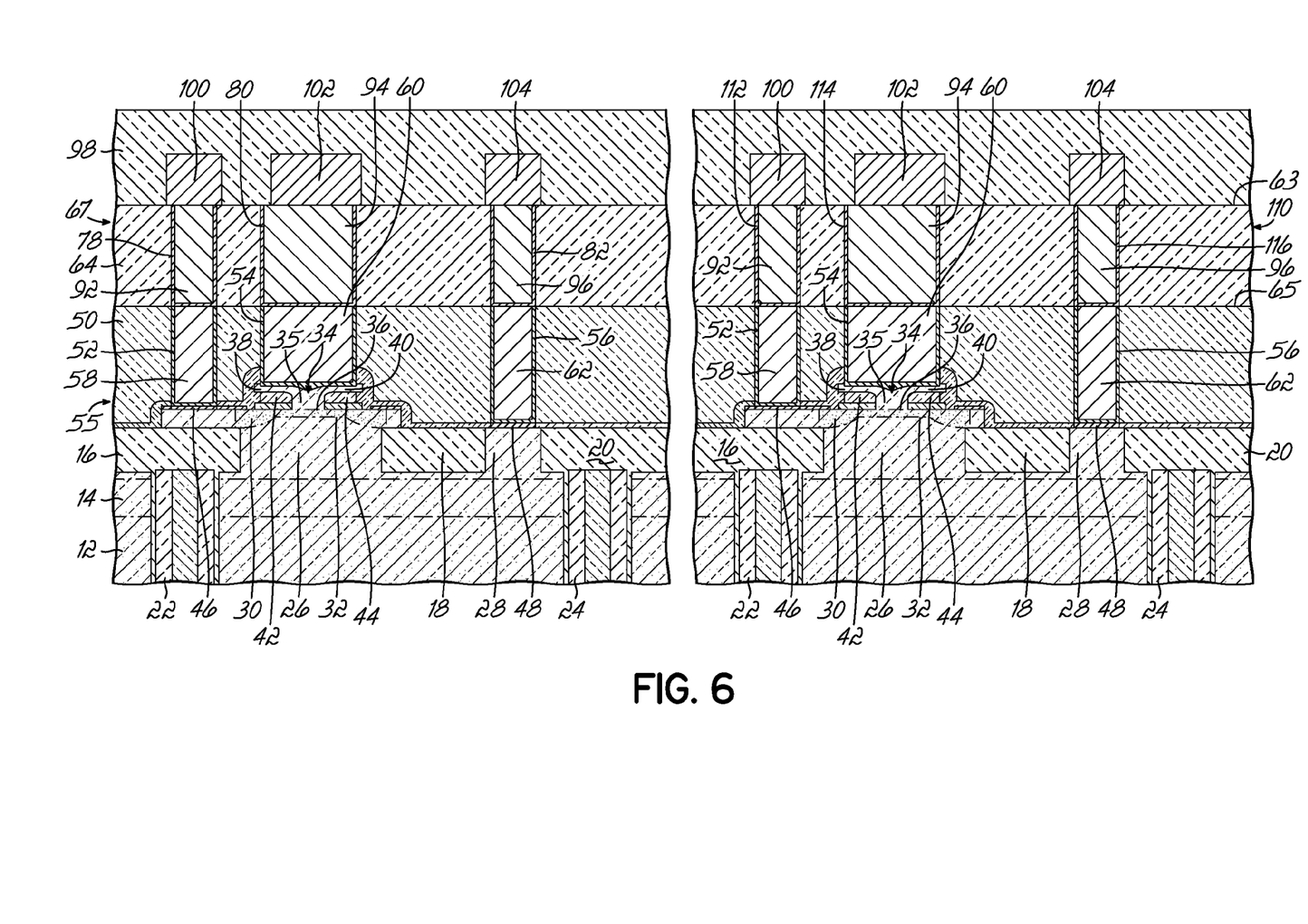
FIG. 6 is a diagrammatic cross-sectional view similar to FIG. 5 of a device structure in accordance with an alternative embodiment of the invention.

With reference to FIG. 6 in which like reference numerals refer to like features in FIG. 5 and in accordance with an alternative embodiment, a contact level 110 similar to contact level 67 may be used with in connection with one or more of the bipolar junction transistors 10. Contact level 110 is fabricated in insulating layer 64 at a different location on the substrate 12 than the contact level 67. In particular, contact level 67 may be used with one group of devices structured like bipolar junction transistor 10 on one region of the substrate 12 and contact level 110 may be used with another group of devices structured like bipolar junction transistor 10 on another region of the substrate 12. These two regions may be on the same chip or die cut from the substrate 12 or, alternatively, in a distinct integrated circuit on a different chip or die. Contact level 110 is directly over local interconnect level 55 and indirectly over the bipolar junction transistor 10 because of the presence of the intervening local interconnect level 55.

Contact level 110 is structurally identical to contact level 67 with the exception that contact level 110 includes liners 112, 114, 116 that are composed of a different material or combination of materials than the liners 78, 80, 82 of contact level 67. For example, liners 112, 114, 116 may be composed of a non-stoichiometric titanium nitride that is enriched in titanium, and liners 78, 80, 82 may be composed of titanium. As another example, liners 78, 80, 82 may be composed of stoichiometric titanium nitride and liners 112, 114, 116 may be composed of a titanium/titanium nitride bilayer. As yet another example, liners 78, 80, 82 may be composed of a titanium nitride/titanium bilayer and liners 112, 114, 116 may be composed of a titanium/titanium nitride bilayer. As yet another example, liners 78, 80, 82 may be composed of a titanium/titanium nitride bilayer in which the titanium nitride has a first stoichiometry and liners 112, 114, 116 may be composed of a titanium/titanium nitride bilayer in which the titanium nitride has a second stoichiometry that differs from the first stoichiometry. Individual photomasking steps are used to form the liners 78, 80, 82 from a different conductive material than liners 112, 114, 116.

Contact level 110, which is fabricated on the same substrate 12 as contact level 67 and, in one embodiment, is fabricated on the same die or chip as contact level 67, may be engineered or tuned so that the bipolar junction transistor 10 associated with contact level 110 has a different current gain (e.g., beta) than the bipolar junction transistor 10 associated with contact level 67. The different current gains are achieved because liners 78, 80, 82 of contact level 67 define stress-imparting structures that apply or impart a different stress to the corresponding impacted bipolar junction transistor 10 than the stress applied by the stress-imparting structures defined by liners 112, 114, 116 in contact level 110, which are composed of a different conductive material composition, to the corresponding impacted bipolar junction transistor 10. The different stresses applied by the contact levels 67, 110 result in differences in the device current gains for the different stress-impacted bipolar junction transistors 10, which are at different spaced-apart locations on the substrate 12.

Figure 7:
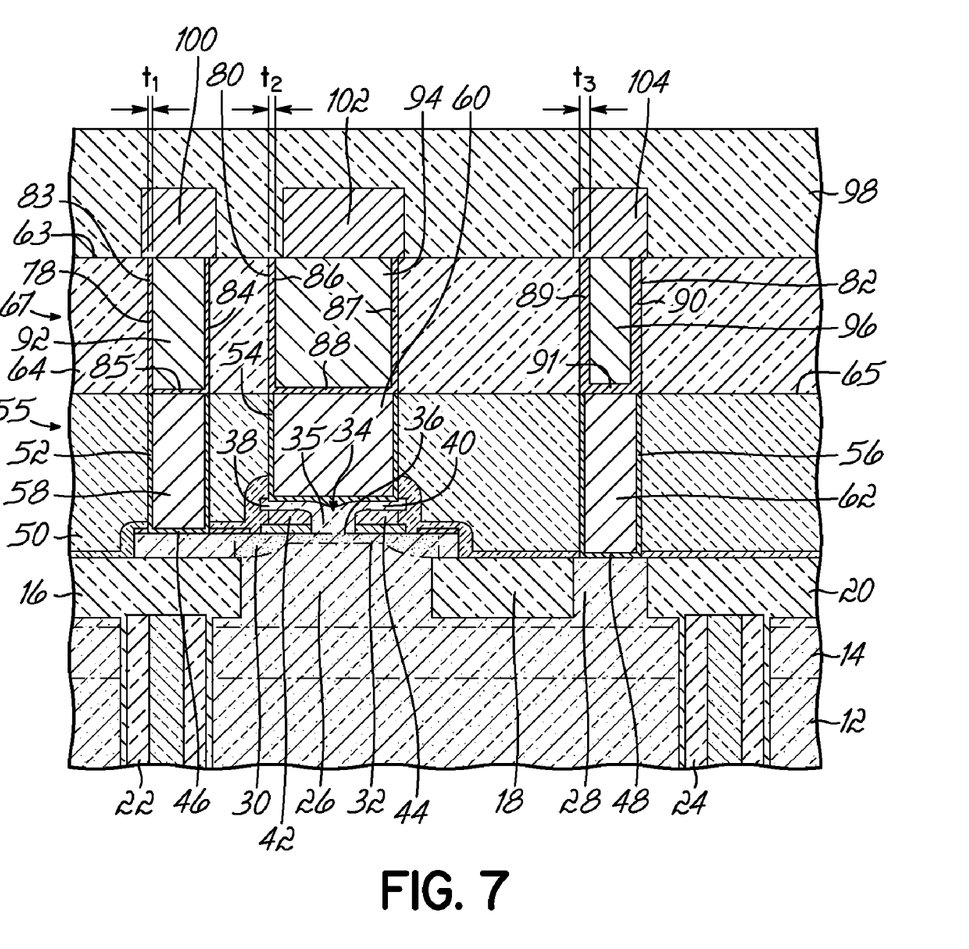
FIG. 7 is a diagrammatic cross-sectional view similar to FIG. 5 of a device structure in accordance with an alternative embodiment of the invention.

With reference to FIG. 7 in which like reference numerals refer to like features in FIG. 5 and in accordance with an alternative embodiment, the physical layer thickness may be modulated among the different liners 78, 80, 82 of contact level 67 such that at least two of the liners 78, 80, 82 have a different physical layer thickness. For example, each of the liners 78, 80, 82 in contact level 67 may have a different physical layer thickness, as depicted in the representative embodiment depicted in FIG. 7. Specifically, the sidewall sections 83, 84 and bottom section 85 of liner 78 have a physical layer thickness, $t_1$, the sidewall sections 86, 87 and bottom section 88 of liner 80 have a physical layer thickness, $t_2$, that differs from thickness, $t_1$, and the sidewall sections 89, 90 and bottom section 91 of liner 82 have a physical layer thickness, $t_3$, that differs from thicknesses, $t_1$ and $t_2$. However, any two of the liners 78, 80, 82 may have the same physical layer thickness and only one of the liners 78, 80, 82 may have a different physical layer thickness.

In one embodiment and in addition to the differing physical layer thicknesses, the liners 78, 80, 82 in contact level 67 may be composed of the same conductive material or combination of conductive materials. Alternatively, at least two of the liners 78, 80, 82 may be composed of a different conductive material or combination of conductive materials, as described above in the context of FIG. 5, in addition to the differing physical layer thicknesses. The ability to also select different conductive materials for the liners 78, 80, 82 provides additional flexibility in tuning the field effect transistor 10.

Stress is indirectly coupled from the liners 78, 80, 82 to the collector region 26, base region 30, and emitter region 34 of the bipolar junction transistor 10 because of the presence of at least the intervening contacts 58, 60, 62 in the local interconnect level 55. Additional intervening structures may be present, such as the reach-through region 28 for stress transfer from the liner 82 to the collector region 26 or the emitter region 34 for stress transfer to the base region 30. Because of the different physical layer thicknesses of at least two of the liners 78, 80, 82, a stress is indirectly transferred to the bipolar junction transistor 10 that can be tuned by thickness selection.

Figure 8:
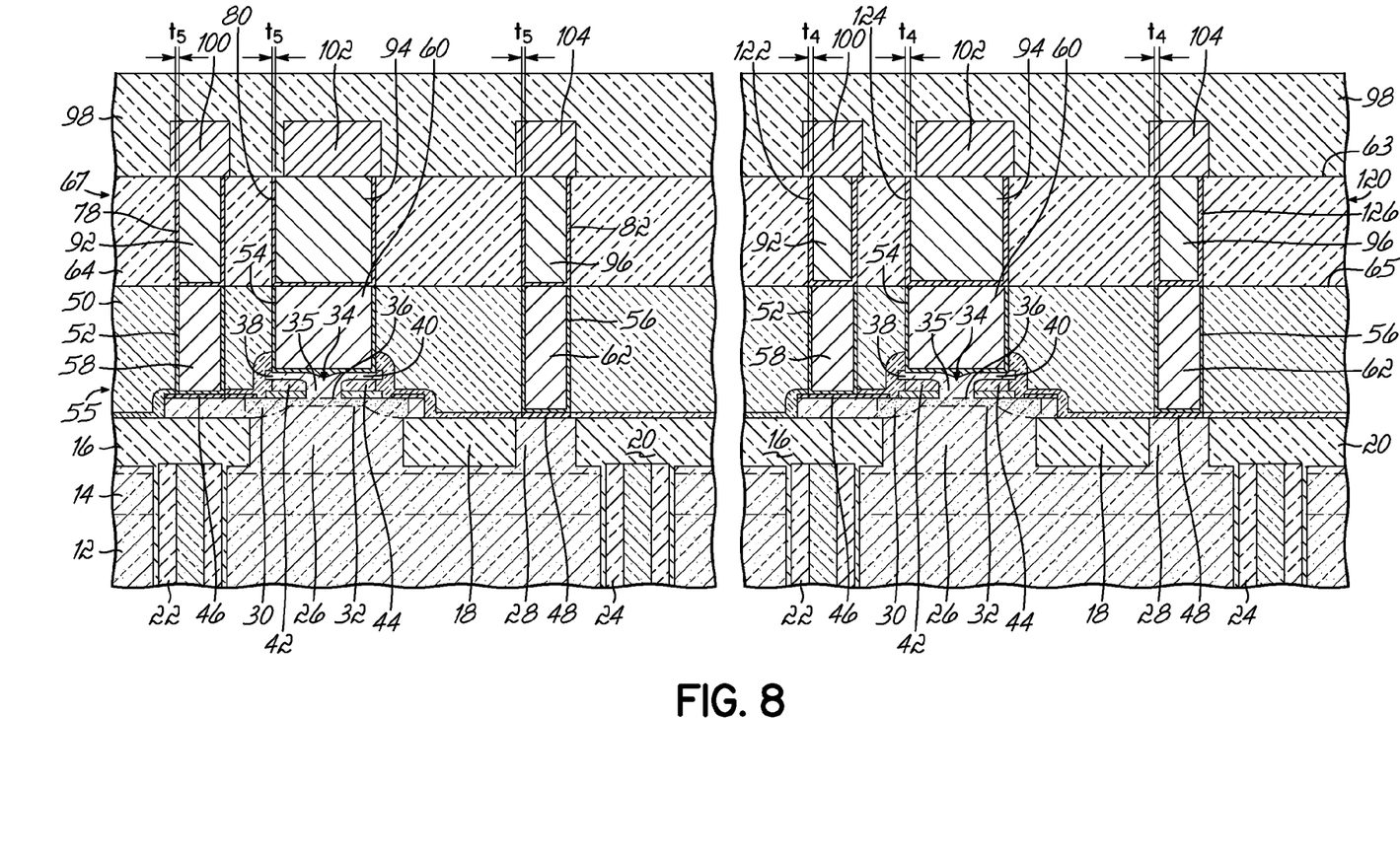
FIG. 8 is a diagrammatic cross-sectional view similar to FIG. 7 of a device structure in accordance with an alternative embodiment of the invention.

With reference to FIG. 8 in which like reference numerals refer to like features in FIGS. 5 and 7 and in accordance with an alternative embodiment, a different contact level 120 may be used with in connection with one or more of the bipolar junction transistors 10. Contact level 120 may be fabricated in insulating layer 64 at a different location on the substrate 12 than the contact level 67. In particular, contact level 67 may be used with one group of devices like bipolar junction transistor 10 on one region of the substrate 12 and contact level 120 may be used with another group of devices like bipolar junction transistor 10 on another region of the substrate 12. These two regions may be on the same chip or die cut from the substrate 12 or, alternatively, in a distinct integrated circuit on a different chip or die. Contact level 120 is directly over local interconnect level 55 and indirectly over the bipolar junction transistor 10 because of the presence of the intervening local interconnect level 55.

Contact level 120 is structurally identical to contact level 67 other than the presence of liners 122, 124, 126 that have a different physical layer thickness, $t_4$, than the physical layer thickness, $t_5$, of liners 78, 80, 82 present in contact level 67. In an alternative embodiment, the thicknesses of liners 78, 80, 82 and/or the thicknesses of liners 122, 124, 126 may be modulated such that at least two of the individual liners 78, 80, 82 have a different physical layer thickness and/or at least two of the individual liners 122, 124, 126 have a different physical layer thickness, in analogy to the embodiment described with regard to FIG. 7.

Stress is indirectly coupled from the liners 122, 124, 126 of contact level 120 to the collector region 26, base region 30, and emitter region 34 of the bipolar junction transistor 10 because of the presence of at least the intervening contacts 58, 60, 62 in the local interconnect level 55. Additional intervening structures may be present, such as the reach-through region 28 for stress transfer from the liner 82 to the collector region 26 or the emitter region 34 for stress transfer to the base region 30. The difference in physical layer thickness results in liners 78, 80, 82 in contact level 67 applying a different stress to the corresponding impacted field effect transistor 10 than the stress applied by liners 122, 124, 126 in contact level 120 to the corresponding impacted field effect transistor 10.

In one embodiment and in additional to the difference in physical layer thickness, liners 122, 124, 126 may be composed of a different conductive material or a different combination of conductive materials than liners 78, 80, 82, in analogy to the embodiment described with regard to FIG. 5. Alternatively, liners 122, 124, 126 may be composed of the same conductive material or combination of conductive materials as liners 78, 80, 82. Modulating the conductive material or combination of conductive materials adds an additional parameter that can be selected in combination with physical layer thickness to tune the current gain of the bipolar junction transistor 10 associated with contact level 120 and the bipolar junction transistor associated with contact level 67.

Contact level 120, which is fabricated on the same substrate 12 as contact level 67 and, in one embodiment, is fabricated on the same die or chip as contact level 67, may be engineered so that the bipolar junction transistor 10 associated with contact level 120 has a different current gain (e.g., beta) than the bipolar junction transistor 10 associated with contact level 67. The different current gains are achieved because liners 78, 80, 82 of contact level 67 apply a different stress to bipolar junction transistor 10 than the stress applied by liners 122, 124, 126 of different composition in contact level 120 to bipolar junction transistor 10. The different stresses applied by the contact levels 67, 120 result in differences in the device current gains for the different stress-impacted bipolar junction transistors 10.

Figure 9:
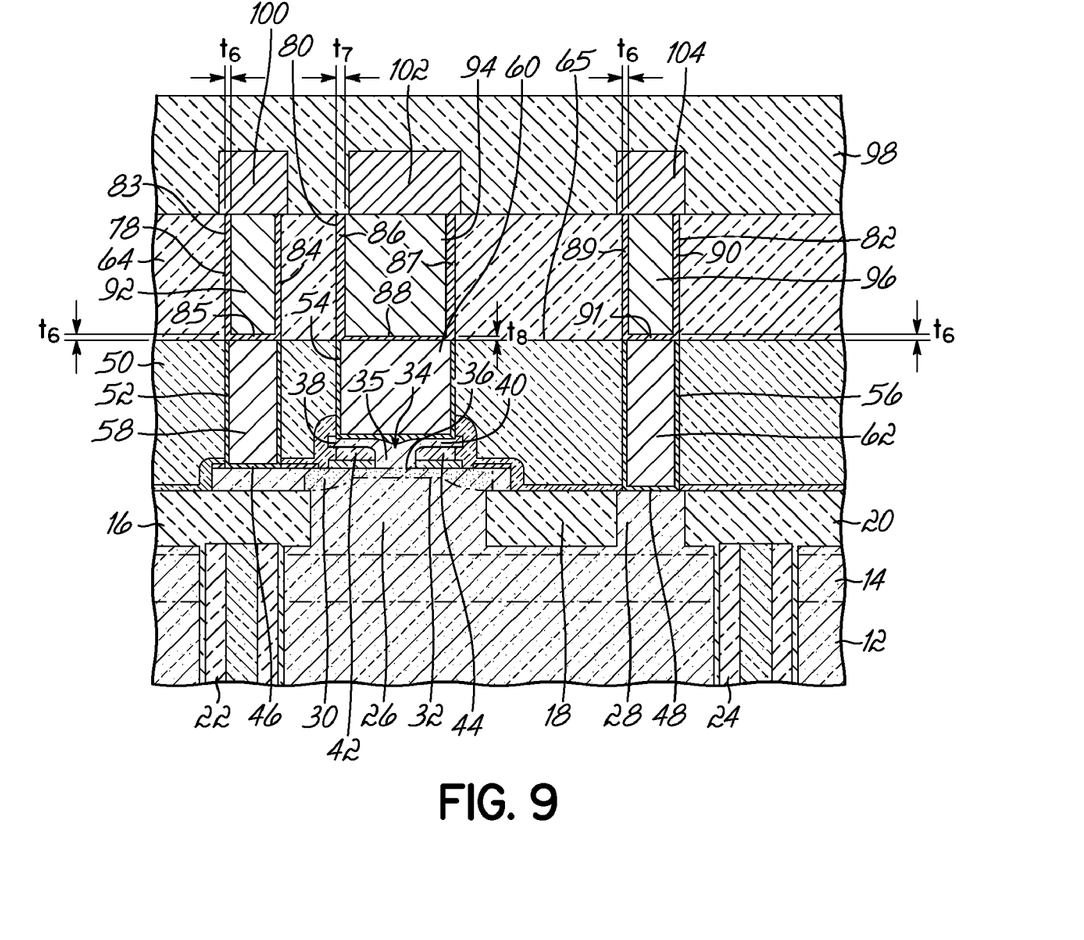
FIG. 9 is a diagrammatic cross-sectional view similar to FIGS. 5 and 7 of a device structure in accordance with an alternative embodiment of the invention.

With reference to FIG. 9 in which like reference numerals refer to like features in FIG. 5 and in accordance with an alternative embodiment, the liners 78, 80, 82 of contact level 67 may be modified such that at least one of the liners 78, 80, 82 has sidewall sections of a different physical layer thickness than its corresponding bottom section. In the representative embodiment, liners 78 and 82 have a uniform physical layer thickness, $t_6$, for all sidewall sections 83, 84, 89, 90, and bottom sections 85, 91, and the sidewall sections 86, 87 of liner 80 have a physical layer thickness, $t_7$, that is greater than the physical layer thickness, $t_8$, of the bottom section 88 of liner 80. The difference in physical layer thickness between the sidewall sections 86, 87 and bottom section 88 can be produced by a deposition-etch process in which the conductive material of liner 80 is deposited into the opening 68 (FIG. 3) and then a portion of the conductive material is sputtered from the deposited layer on the bottom section 88 onto sidewall sections 86, 87. The deposition-etch process operates to thin the bottom section 88 relative to the sidewall sections 86, 87.

In alternative embodiments, the sidewall sections 83, 84 of liner 78 may differ in physical layer thickness relative to the bottom section 85 and/or the sidewall sections 89, 90 of liner 82 may differ in physical layer thickness relative to the bottom section 91. Various other combinations of physical layer thicknesses are contemplated for the vertical and bottom sections, so long as at least one of the liners 78, 80, 82 of contact level 67 has sidewall sections that are different than its respective bottom section. Because of the different sets of physical layer thicknesses for at least one of the liners 78, 80, 82, a stress is indirectly transferred to the bipolar junction transistor 10 that can be tuned by thickness selection.

In one embodiment and in addition to the different thickness between the sidewall sections and bottom section of at least one of the liners 78, 80, 82, the liners 78, 80, 82 may be composed of the same conductive material or combination of conductive materials. Alternatively, at least two of the liners 78, 80, 82 may be composed of a different conductive material or combination of conductive materials, as described above in the context of FIG. 5, in addition to the different thickness between the sidewall sections and bottom section of at least one of the liners 78, 80, 82. The ability to also select different conductive materials for the liners 78, 80, 82 provides additional flexibility in tuning the field effect transistor 10.

Figure 10:
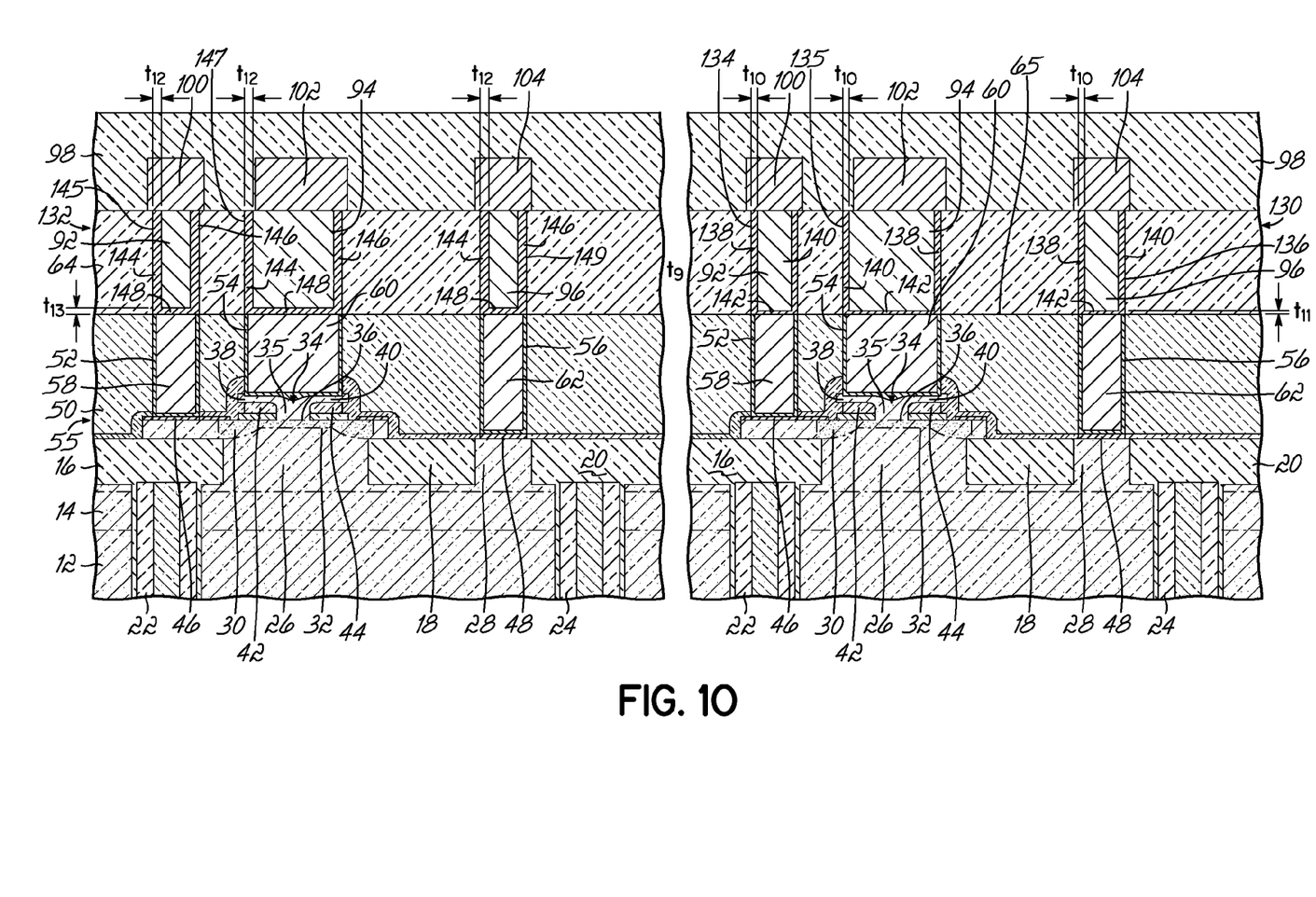
FIG. 10 is a diagrammatic cross-sectional view similar to FIG. 9 of a device structure in accordance with an alternative embodiment of the invention.

With reference to FIG. 10 in which like reference numerals refer to like features in FIGS. 5 and 9 and in accordance with an alternative embodiment, different contact levels 130, 132, each similar to contact level 67, may be used with in connection with one or more of the bipolar junction transistors 10. Contact level 130 may be fabricated at a different location on the substrate 12 than the contact level 132 associated with bipolar junction transistor 10. In particular, contact level 130 may be used with one group of devices like bipolar junction transistor 10 on one region of the substrate 12 and contact level 132 may be used with another group of devices like bipolar junction transistor 10 on another region of the substrate 12. These two regions may be on the same chip or die cut from the substrate 12 or, alternatively, in a distinct integrated circuit on a different chip or die. Contact levels 130, 132 are directly over local interconnect level 55 and indirectly over one of the bipolar junction transistors 10 because of the presence of the intervening local interconnect level 55.

Contact level 130 is structurally identical to contact level 67 with the exception that contact level 130 includes liners 134, 135, 136, similar to liners 78, 80, 82, that have vertical and bottom sections with a non-unitary thickness ratio. Specifically, liners 134, 135, 136 of contact level 130 each include sidewall sections 138, 140 with a physical thickness, $t_{10}$, and a bottom section 142 with a physical layer thickness, $t_{11}$, in which physical layer thickness, $t_{11}$, is thinner than physical layer thickness, $t_{10}$. Contact level 132 is structurally identical to contact level 130 with the exception that contact level 132 includes liners 145, 147, 149, similar to liners 78, 80, 82, that have vertical and bottom sections with a non-unitary thickness ratio. Specifically, liners 145, 147, 149 of contact level 132 each include sidewall sections 144, 146 with a physical thickness, $t_{12}$, and a bottom section 148 with a physical layer thickness, $t_{13}$, in which physical layer thickness, $t_{13}$, is thinner than physical layer thickness, $t_{12}$. In an alternative embodiment, the liners 145, 147, 149 may have a uniform physical layer thickness, similar to liners 78, 80, 82 (FIG. 5).

Stress is indirectly coupled from the liners 134, 135, 136 of contact level 130 to the collector region 26, base region 30, and emitter region 34 of the underlying bipolar junction transistor 10 because of the presence of at least the intervening contacts 58, 60, 62 in the local interconnect level 55. Additional intervening structures may be present, such as the reach-through region 28. Stress is also indirectly coupled from the liners 145, 147, 149 of contact level 132 to the collector region 26, base region 30, and emitter region 34 of the underlying bipolar junction transistor 10 because of the presence of at least the intervening contacts 58, 60, 62 in the local interconnect level 55. Again, additional intervening structures may be present, such as the reach-through region 28 for stress transfer from the liner 82 to the collector region 26 or the emitter region 34 for stress transfer to the base region 30.

Because the set of physical layer thicknesses for liners 134, 135, 136 differs from the set of physical layer thicknesses for liners 145, 147, 149, the stress that is transferred to the bipolar junction transistor 10 connected with contact level 130 differs from the stress that is transferred from contact level 132 to the bipolar junction transistor 10 connected with contact level 132. The different stresses applied by the contact levels 130, 132 produce different device current gains for the respective stress-impacted bipolar junction transistors 10.

In one embodiment, the liners 134, 135, 136 of contact level 130 may be composed of a different conductive material or a different combination of conductive materials than liners 145, 147, 149, in analogy to the embodiment described with regard to FIG. 5. Alternatively, the liners 134, 135, 136 may be composed of the same conductive material or combination of conductive materials as liners 145, 147, 149.

Contact level 130, which is fabricated on the same substrate 12 as contact level 132 and, in one embodiment, is fabricated on the same die or chip as contact level 132, may be engineered so that the bipolar junction transistor 10 associated with contact level 130 has a different current gain (e.g., beta) than the bipolar junction transistor 10 associated with contact level 132. The different current gains are achieved because liners 145, 147, 149 of contact level 132 apply a different stress to bipolar junction transistor 10 than the stress applied by liners 134, 135, 136 of different composition in contact level 130 to bipolar junction transistor 10. The different stresses applied by the contact levels 130, 132 result in differences in the device current gains for the stress-impacted bipolar junction transistors 10.

Figure 11:
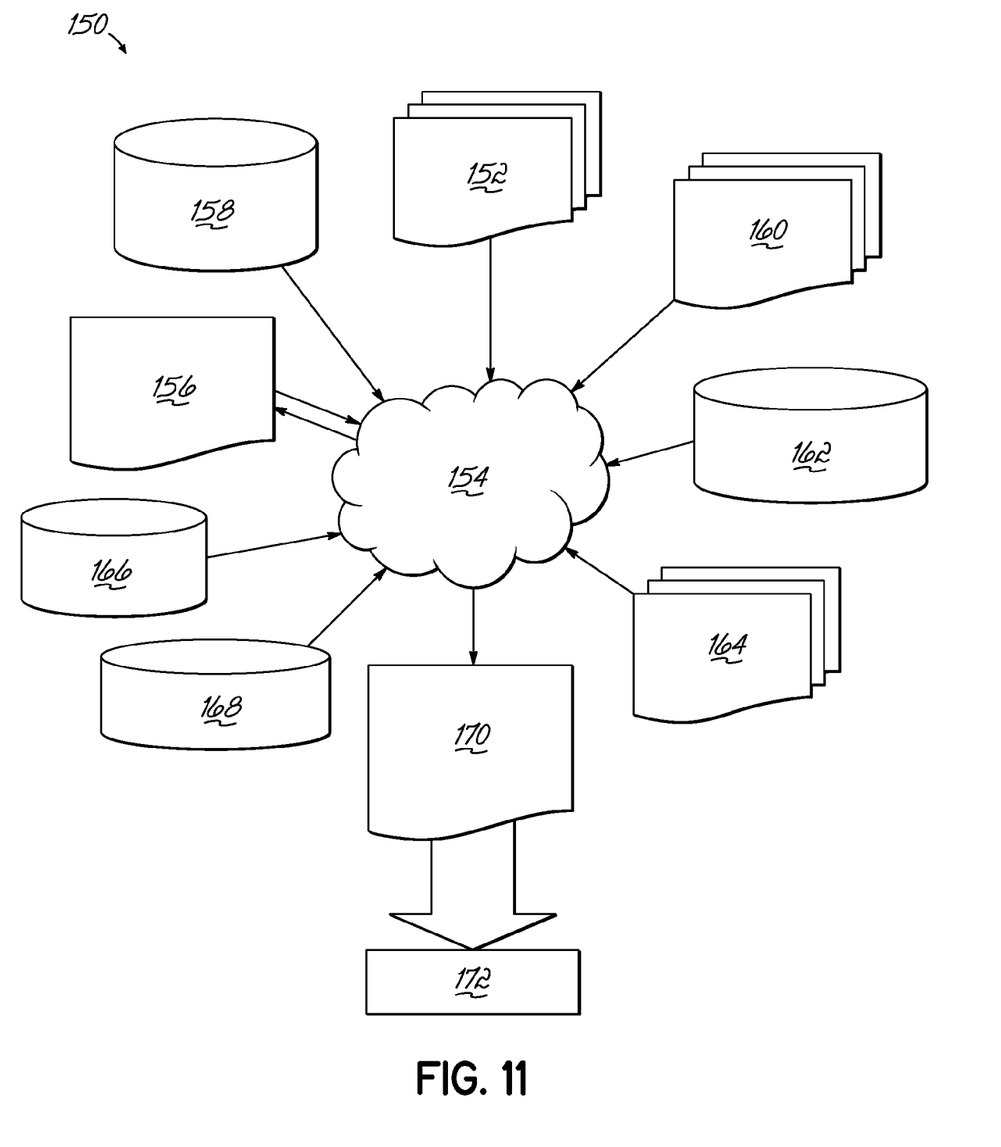
FIG. 11 is a flow diagram of a design process used in semiconductor design, manufacture, and/or test.

FIG. 11 shows a block diagram of an exemplary design flow 150 used for example, in semiconductor design, manufacturing, and/or test. Design flow 150 may vary depending on the type of integrated circuit (IC) being designed. For example, a design flow 150 for building an application specific IC (ASIC) may differ from a design flow 150 for designing a standard component. Design structure 152 is preferably an input to a design process 154 and may come from an IP provider, a core developer, or other design company or may be generated by the operator of the design flow, or from other sources. Design structure 152 comprises an embodiment of the invention as shown in at least one of FIGS. 5, 6, 7, 8, 9, 10 in the form of schematics or HDL, a hardware-description language (e.g., Verilog, VHDL, C, etc.). Design structure 152 may be contained on one or more machine readable medium. For example, design structure 152 may be a text file or a graphical representation of an embodiment of the invention as shown in at least one of FIGS. 5, 6, 7, 8, 9, 10. Design process 154 preferably synthesizes (or translates) an embodiment of the invention as shown in at least one of FIGS. 5, 6, 7, 8, 9, 10 into a netlist 156, where netlist 156 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 156 is resynthesized one or more times depending on design specifications and parameters for the circuit.

Design process 154 may include using a variety of inputs; for example, inputs from library elements 158 which may house a set of commonly used elements, circuits, and devices, including models, layouts, and symbolic representations, for a given manufacturing technology (e.g., different technology nodes, 32 nm, 45 nm, 90 nm, etc.), design specifications 160, characterization data 162, verification data 164, design rules 166, and test data files 168 (which may include test patterns and other testing information). Design process 154 may further include, for example, standard circuit design processes such as timing analysis, verification, design rule checking, place and route operations, etc. One of ordinary skill in the art of integrated circuit design can appreciate the extent of possible electronic design automation tools and applications used in design process 154 without deviating from the scope and spirit of the invention. The design structure of the invention is not limited to any specific design flow.

Design process 154 preferably translates an embodiment of the invention as shown in at least one of FIGS. 5, 6, 7, 8, 9, 10, along with any additional integrated circuit design or data (if applicable), into a second design structure 170. Design structure 170 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 170 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in at least one of FIGS. 5, 6, 7, 8, 9, 10. Design structure 170 may then proceed to a stage 172 where, for example, design structure 170 proceeds to tape-out, is released to manufacturing, is released to a mask house, is sent to another design house, is sent back to the customer, etc.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The term "vertical" refers to a direction perpendicular to the horizontal, as just defined. Terms, such as "on", "above", "below", "side" (as in "sidewall"), "upper", "lower", "over", "beneath", and "under", are defined with respect to the horizontal plane. It is understood that various other frames of reference may be employed for describing the invention without departing from the spirit and scope of the invention. It is also understood that features of the invention are not necessarily shown to scale in the drawings. Furthermore, to the extent that the terms "includes", "having", "has", "with", or variants thereof are used in either the detailed description or the claims, such terms are intended to be inclusive in a manner similar to the term "comprising."

It will be understood that when an element as a layer, region or substrate is described as being "on" or "over" another element, it can be directly on or over the other element or intervening elements may also be present. In contrast, when an element is described as being "directly on" or "directly over" another element, there are no intervening elements present. When an element is described as being "indirectly on" or "indirectly over" another element, there are intervening elements present. It will also be understood that when an element is described as being "connected" or "coupled" to another element, it can be directly connected or coupled to the other element or intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

The fabrication of the semiconductor structure herein has been described by a specific order of fabrication stages and steps. However, it is understood that the order may differ from that described. For example, the order of two or more fabrication steps may be swapped relative to the order shown. Moreover, two or more fabrication steps may be conducted either concurrently or with partial concurrence. In addition, various fabrication steps may be omitted and other fabrication steps may be added. It is understood that all such variations are within the scope of the present invention. It is also understood that features of the present invention are not necessarily shown to scale in the drawings.

While the invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A device structure for use on a substrate, the device structure comprising:
    a first semiconductor device formed using the substrate;
    a second semiconductor device formed using the substrate, the second semiconductor device spaced apart on the substrate from the first semiconductor device;
    an insulating layer over the first and second semiconductor devices;

a first contact extending through the insulating layer toward the portion of the first semiconductor device;

a first intervening structure between the first contact and the portion of the first semiconductor device;

a first stress-imparting structure indirectly coupled with a portion of the first semiconductor device, the first stress-imparting structure configured to impart a first stress to the first semiconductor device; and a second stress-imparting structure indirectly coupled with a portion of the second semiconductor device, the second stress-imparting structure configured to impart a second stress to the second semiconductor device that differs in magnitude from the first stress;

wherein the first stress-imparting structure is a first liner that is partially disposed between the first contact and the insulating layer and that is also partially disposed between the first contact and the portion of the first semiconductor device.

2. The device structure of claim 1 further comprising:

a second contact extending through the insulating layer toward the portion of the second semiconductor device, wherein the second stress-imparting structure is a second liner partially disposed between the second contact and the insulating layer and partially disposed between the second contact and the portion of the second semiconductor device.

3. The device structure of claim 2 wherein the first and second liners are composed of different conductive materials or combinations of conductive materials, the first and second liners have different physical layer thicknesses, or at least one of the first and second liners has vertical sections and a bottom section with a different physical layer thickness than the vertical sections.

4. A device structure for use on a substrate, the device structure comprising:

a first semiconductor device formed using the substrate;

a second semiconductor device formed using the substrate, the second semiconductor device spaced apart on the substrate from the first semiconductor device;

an insulating layer directly on the first and second semiconductor devices;

a first contact extending through the insulating layer to establish a first electrical connection with the portion of the first semiconductor device;

a first stress-imparting structure indirectly coupled with a portion of the first semiconductor device, the first stress-imparting structure configured to impart a first stress to the first semiconductor device; and a second stress-imparting structure indirectly coupled with a portion of the second semiconductor device, the second stress-imparting structure configured to impart a second stress to the second semiconductor device that differs in magnitude from the first stress; and wherein the first contact transfers the first stress from the first stress-imparting structure to the portion of the first semiconductor device.

5. The device structure of claim 4 further comprising:

a second contact extending through the insulating layer to establish a second electrical connection with the second semiconductor device, wherein the second contact transfers the second stress from the second stress-imparting structure to the portion of the second semiconductor device.

6. The device structure of claim 1 wherein the first and second semiconductor devices and the first and second stress-imparting structures are disposed on a common chip cut from the substrate.

7. The device structure of claim 1 wherein the first semiconductor device is a first bipolar junction transistor, the second semiconductor device is a second bipolar junction transistor, and the first and second stresses applied by the first and second stress-applying structures cause the first and second bipolar junction transistors to have distinct current gains.

8. The device structure of claim 4 wherein the first and second semiconductor devices and the first and second stress-imparting structures are disposed on a common chip cut from the substrate.

9. The device structure of claim 4 wherein the first semiconductor device is a first bipolar junction transistor, the second semiconductor device is a second bipolar junction transistor, and the first and second stresses applied by the first and second stress-applying structures cause the first and second bipolar junction transistors to have distinct current gains.

10. A device structure comprising: a bipolar junction transistor including a first device collector region, a base region, and a second device an emitter region; a first stress-imparting structure indirectly coupled with a first device region selected from the collector region, the base region, or the emitter region, the first stress-imparting structure configured to impart a first stress to the first device region of the bipolar junction transistor ; and a second stress-imparting structure indirectly coupled with a second device region different from the first device region and selected from the collector region, the base region, or the emitter region of the bipolar junction transistor, the second stress-imparting structure configured to impart a second stress to the second device region that differs in magnitude from the first stress.

11. The device structure of claim 10 further comprising:

an insulating layer over the semiconductor device;

a first contact extending through the insulating layer toward the first device region; and a first intervening structure between the first contact and the first device region, wherein the first stress-imparting structure is a first liner partially disposed between the first contact and the insulating layer and partially disposed between the second contact and the second device region.

12. The device structure of claim 11 further comprising:

a second contact extending through the insulating layer toward the second device region; and a second intervening structure between the second contact and the second device region, wherein the second stress-imparting structure is a second liner partially disposed between the second contact and the insulating layer and partially disposed between the second contact and the second device region.

13. The device structure of claim 12 wherein the first and second liners are composed of different conductive materials or combinations of conductive materials, the first and second liners have different physical layer thicknesses, or at least one of the first and second liners has vertical sections and a bottom section, and said vertical sections have a different physical layer thickness than the bottom section.

14. The device structure of claim 10 further comprising:

an insulating layer directly on the first and second semiconductor device; and a first contact extending through the insulating layer to establish a first electrical connection with the first device region of the semiconductor device;

wherein the first contact transfers the first stress from the first stress-imparting structure to the first device region of the semiconductor device.

15. The device structure of claim 14 further comprising:
a second contact extending through the insulating layer to establish a second electrical connection with the second device region of the semiconductor device,
wherein the second contact transfers the second stress from the second stress-imparting structure to the second device region of the semiconductor device.

16. The device structure of claim 10 wherein the first and second stresses applied by the first and second stress-applying structures permit tuning of a current gain of the bipolar junction transistor.

* * * * *